(12) United States Patent
Rao et al.

(10) Patent No.: US 12,068,748 B2
(45) Date of Patent: Aug. 20, 2024

(54) CONFIGURABLE PRIME NUMBER DIVIDER USING MULTI-PHASE CLOCKS

(71) Applicant: Avago Technologies International Sales Pte. Limited, Singapore (SG)

(72) Inventors: Lakshmi Rao, Newport Beach, CA (US); Siavash Fallahi, Newport Coast, CA (US); Tim Yee He, Irvine, CA (US); Ali Nazemi, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/898,175

(22) Filed: Aug. 29, 2022

(65) Prior Publication Data

US 2024/0072770 A1    Feb. 29, 2024

(51) Int. Cl.
*H03K 21/02* (2006.01)
*G06F 1/08* (2006.01)
*H03K 3/012* (2006.01)

(52) U.S. Cl.
CPC ............ *H03K 3/012* (2013.01); *G06F 1/08* (2013.01); *H03K 21/02* (2013.01)

(58) Field of Classification Search
CPC .......... H03K 3/012; H03K 21/02; G06F 1/08
See application file for complete search history.

(56) References Cited

U.S. PATENT DOCUMENTS

| | | | |
|---|---|---|---|
| 6,281,759 B1* | 8/2001 | Coffey | H03L 7/0996 331/25 |
| 6,617,893 B1* | 9/2003 | Born | H03K 23/68 327/248 |
| 2008/0094113 A1* | 4/2008 | Kuan | H03K 23/68 327/117 |
| 2008/0136471 A1* | 6/2008 | Kamath | H03L 7/0816 327/156 |
| 2016/0004273 A1* | 1/2016 | Chiang | G06F 1/08 713/503 |

* cited by examiner

*Primary Examiner* — Sibin Chen
(74) *Attorney, Agent, or Firm* — Foley & Lardner LLP

(57) ABSTRACT

A device is provided that includes a counter circuit configured to count cycles of an input clock signal and to generate an output clock signal periodically based on a cycle count of the input clock signal; a multi-phase clock generator configured to generate a plurality of multi-phase clock signals from a system clock signal; a multiplexer circuit coupled to the multi-phase clock generator and configured to provide a multi-phase clock signal selected from the plurality of multi-phase clock signals to the counter circuit as the input clock signal; and a selection circuit configured to provide a selection signal to the multiplexer circuit periodically to switch the multi-phase clock signal provided to the counter circuit from a current multi-phase clock signal to a next multi-phase clock signal selected from the plurality of multi-phase clock signals.

11 Claims, 11 Drawing Sheets

CONFIGURABLE PRIME NUMBER DIVIDER USING MULTI-PHASE CLOCKS

TECHNICAL FIELD

The present description relates generally to data communications hardware including, for example, clock generation for data communications hardware.

BACKGROUND

Data rates provided by data communications systems are steadily increasing. With an increase in data rates comes an increase in the complexity of signal processing to support the higher data rates and the requirements for clocks at various frequencies for different aspects of the signal processing. Dividers used to generate the clocks at different frequencies may become speed bottlenecks as the frequencies of the input clocks to the dividers increase.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

Figure 1:
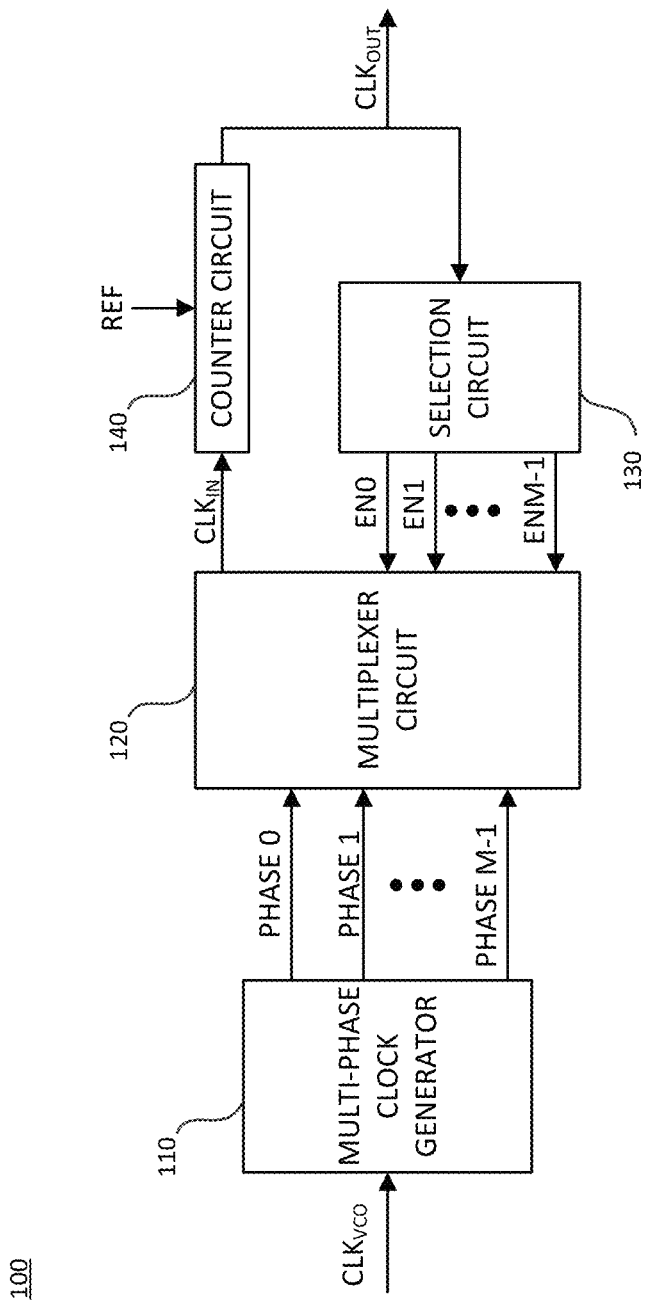
FIG. 1 is a block diagram depicting components of a frequency divider device according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

A system clock signal may be generated using a voltage-controlled oscillator, for example, and provided to components of a system to synchronize operations of the components and/or communications between the components. Frequency dividers may be used to generate clock signals from the system clock signal for individual components, where the generated clock signals have frequencies divided down from the frequency of the system clock signal. For example, a 20 GHz system clock signal may be divided down to generate clock signals having frequencies of 10 GHz (division ratio of 2), 2 GHz (division ratio of 10), 500 MHz (division ratio of 40), etc. A divider loop of a frequency divider may represent a cyclical path through logic and circuit elements of the frequency divider through which signals are propagated during cycles of operation. The critical divider loop may be the divider loop having a timing margin that constrains the speed at which the frequency divider can successfully operate. Increasing the frequency of the system clock signal and/or increasing the complexity of the logic and circuitry of the frequency divider reduces the divider-loop timing margin and may result in operational failure of the frequency divider. Frequency dividers configured for prime number division ratios can be especially challenging as system clock frequencies increase.

The subject technology provides a frequency divider device that is configurable for prime number division ratios and moves the speed critical divider loop to a reduced frequency portion of the device. For example, the subject technology proposes a frequency divider device that cascades a multi-phase clock generator and a phase-switching multiplexer circuit with a counter circuit. The multi-phase clock generator may be configured to generate multi-phase clock signals from a system clock signal that are staggered in phase and reduced in frequency from the system clock signal. The multiplexer circuit may be configured to switch between multi-phase clock signals having different phases to provide a modulated input clock signal to the counter circuit. The counter circuit may be configured to count cycles of the input clock signal and to generate an output clock signal based on the cycle count of the input clock signal and a reference value. In this manner, the subject technology provides a frequency divider device that is capable of providing division ratios, including prime number division ratios, with timing margins that can accommodate a range of frequencies. Aspects and benefits of the subject technology are described in further detail below.

FIG. 1 is a block diagram depicting components of a frequency divider device according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 1, frequency divider device 100 includes multi-phase clock generator 110, multiplexer circuit 120, selection circuit 130, and counter circuit 140. All the components of frequency divider device 100 may be implemented in a single semiconductor device, such as a system on a chip (SoC). Alternatively, one or more of the components of frequency divider device 100 may be implemented in a semiconductor device separate from the other components and mounted on a printed circuit board, for example, with the other components to form a system. In addition, one or more circuit elements may be shared between multiple circuit components depicted in FIG. 1. The subject technology is not limited to these two alternatives and may be implemented using other combinations of chips, devices, packaging, etc. to implement frequency divider device 100.

According to aspects of the subject technology, multi-phase clock generator 110 includes suitable logic, circuitry, and/or code to generate M multi-phase clock signals (e.g., phase 0, phase 1, . . . phase M−1) from system clock signal $CLK_{VCO}$ having frequency $F_{VCO}$. The system clock signal may be generated by a voltage-controlled oscillator, for example, external to frequency divider device 100 or incorporated into frequency divider device 100. The subject technology is not limited to any particular frequency for the system clock signal.

According to aspects of the subject technology, multi-phase clock generator 110 is configured to generate the multi-phase clock signals with a division ratio of M relative to the frequency of the system clock signal. Accordingly, each of the multi-phase clock signals may have a frequency of $F_{VCO}/M$. While all of the multi-phase clock signals may share a common frequency, each of the multi-phase clock signals may be shifted in phase relative to the other multi-phase clock signals. For example, a clock cycle may be equally divided by the number of multi-phase clock signals (M) and the multi-phase clock signals may be associated with different portions of the divided clock cycle and have phase shifts corresponding to the associated portions. For example, if M=4 resulting in the generation of a sequence of four multi-phase clock signals (phase 0, phase 1, phase 2, and phase 3), phase 0 may have no phase shift, phase 1 may be shifted by 90 degrees, phase 2 may be shifted by 180 degrees, and phase 3 may be shifted by 270 degrees. Accordingly, each multi-phase clock signal is phase shifted relative to the adjacent multi-phase clock signals in the sequence. In addition, the duty cycles of the generated multi-phase clock signals may be selected based on the number of multi-phase clock signals M. For example, all of the multi-phase clock signals may have a duty cycle ratio equal to the inverse of M. Continuing with the example of M=4, the duty cycle ratio of each multi-phase clock signal would be ¼ or a 25% duty cycle.

The subject technology is not limited to any particular value for M. The number of multi-phase clock signals and the relative phase shifts between the multi-phase clock signals may impact timing margins within frequency divider device 100 and therefore may be selected to maximize timing margins based on testing and/or simulation data. According to aspects of the subject technology, the value of M may be a power of two (e.g., four, eight). With M being a power of two, multi-phase clock generator 110 may be implemented using any of a number of techniques in current-mode logic (CIVIL) or complimentary metal-oxide semiconductor (CMOS) technologies.

According to aspects of the subject technology, multiplexer circuit 120 includes suitable logic, circuitry, and/or code to provide one of the multi-phase clock signals selected by a selection signal from selection circuit 130 as an input clock signal, $CLK_{IN}$, to counter circuit 140. Selection circuit 130 includes suitable logic, circuitry, and/or code to provide the selection signal to multiplexer circuit 120 to periodically change the multi-phase clock signal selected and provided by multiplexer circuit 120 to counter circuit 140 based on an output clock signal $CLK_{OUT}$ generated by counter circuit 140. Examples of the selection circuit and its operation are described below in connection with FIGS. 6 and 9.

Multiplexer circuit 120 may be coupled to multi-phase clock generator 110 such that a sequence of the multi-phase clock signals is provided to inputs of multiplexer circuit 120 so that multiplexer 120 may selectively provide one of the multi-phase clock signals from the sequence as the input clock signal to counter circuit 140. The sequence of multi-phase clock signals may include all of the multi-phase clock signals generated by multi-phase clock generator 110 in an order corresponding to the relative phase shifts. Alternatively, the sequence of multi-phase clock signals may include a subset of the generated multi-phase clock signals such as every other one (e.g., phase 0 and phase 2) to provide variation in the available range of division ratios, as described in more detail below.

Figure 2:
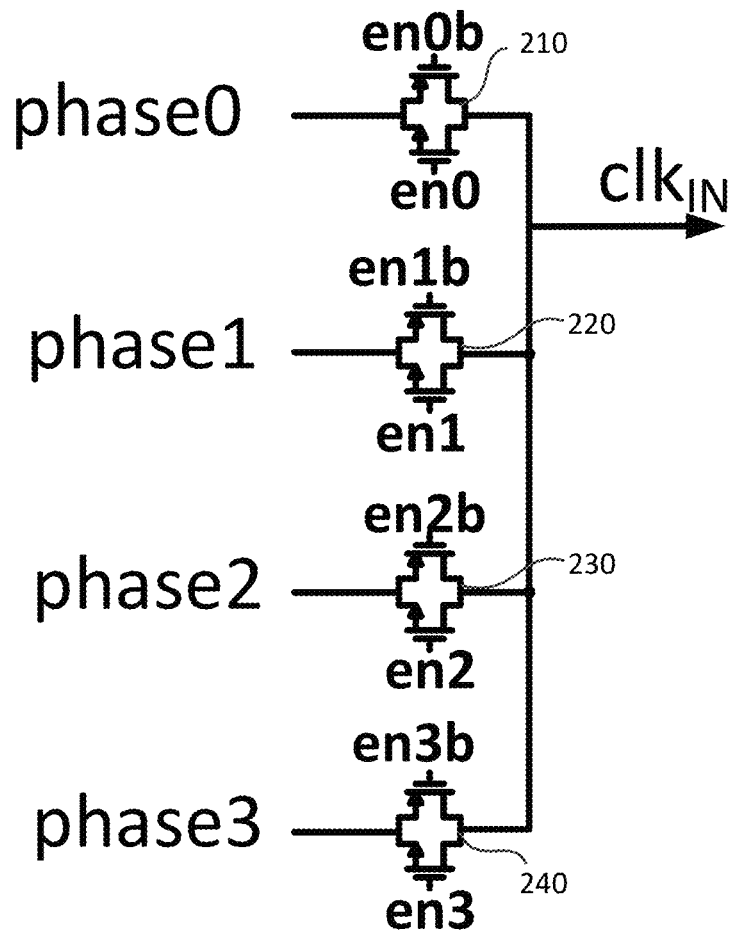
FIG. 2 is a diagram illustrating components of an analog multiplexer circuit according to aspects of the subject technology.

According to aspects of the subject technology, multiplexer circuit 120 may be implemented using an analog multiplexer. FIG. 2 is a diagram illustrating components of an analog multiplexer circuit according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 2, multiplexer circuit 200 includes four transmission gates 210, 220, 230, and 240. The inputs of transmission gates 210, 220, 230, and 240 are coupled to multi-phase clock generator 110 to receive respective ones of the generated multi-phase clock signals phase 0, phase 1, phase 2, and phase 3 (for the M=4 example). The outputs of transmission gates 210, 220, 230, and 240 are coupled to counter circuit 140 to provide a selected one of the multi-phase clock signals as the input clock signal $CLK_{IN}$ to counter circuit 140. The transmission gates are enabled one at a time by respective pairs of selection signals provided by selection circuit 130. For example, transmission gate 210 is enabled when selection signals en0 and en0b are active, transmission gate 220 is enabled when selection signals en1 and en1b are active, transmission gate 230 is enabled when selection signals en2 and en2b are active, and transmission gate 240 is enabled when selection signals en3 and en3b are active.

Figure 3:
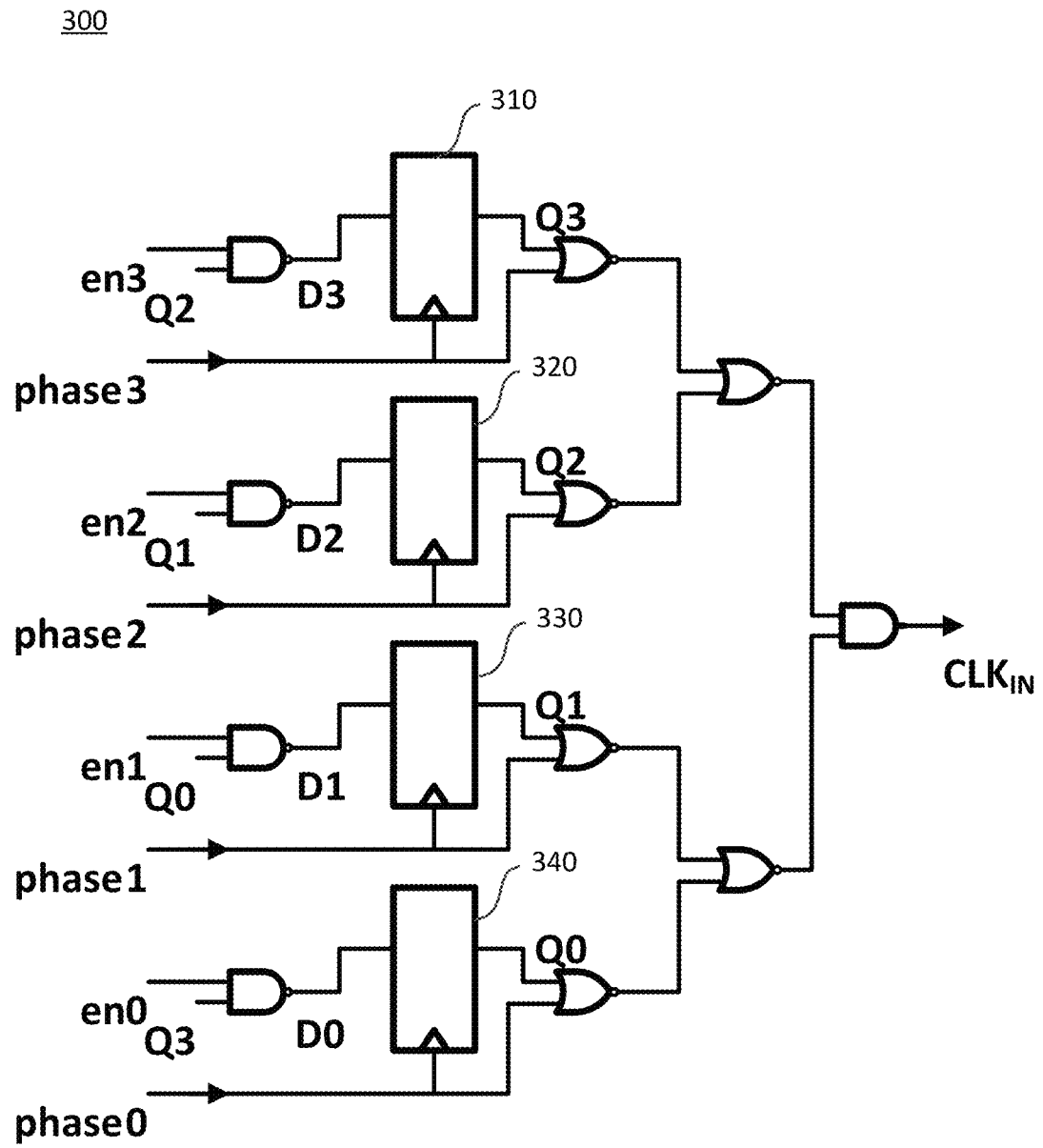
FIG. 3 is a diagram illustrating components of a digital multiplexer circuit according to aspects of the subject technology.

According to aspects of the subject technology, multiplexer circuit 120 may be implemented using a digital multiplexer. FIG. 3 is a diagram illustrating components of a digital multiplexer circuit according to aspects of the subject technology. Not all of the depicted components may be required, however, and one or more implementations may include additional components not shown in the figure.

Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 3, multiplexer circuit 300 includes four D flip-flops 310, 320, 330, and 340. Each of the D flip-flops receives as an input (D0, D1, D2, D3) a respective selection signal (en0, en1, en2, en3) that is retimed via a NAND gate using an output (Q0, Q1, Q2, Q3) of the D flip-flop corresponding to a preceding multi-phase clock signal. For example, en3 is retimed using Q2, en2 is retimed using Q1, en1 is retimed using Q0, and en0 is retimed using Q3. Retiming the selection signal ensures that a current multi-phase clock signal is deselected before selecting the next multi-phase clock signal. The D flip-flops are clocked using a respective multi-phase clock signal (phase0, phase1, phase 2, phase 3) and the selected multi-phase clock signal is provided to counter circuit 140 as an input clock signal via two tiers of NOR gates and an AND gate.

The critical timing in implementations using multiplexer circuit 300 occurs when switching between consecutive multi-phase clock signals (e.g., switching from phase 2 to phase 3). The divider loop for this critical timing includes a D flip-flop (e.g., D flip-flop 320) and one logic gate (e.g., NAND gate generating D3). While the time available for making this switch (e.g., $1/F_{VCO}$) may be similar to that provided by other solutions, the number of logic or circuit elements in the critical divider loop is less than the number of elements used in other solutions. Accordingly, the subject technology allows higher frequencies ($F_{VCO}$) to be used without violating critical timing requirements.

Figure 4:
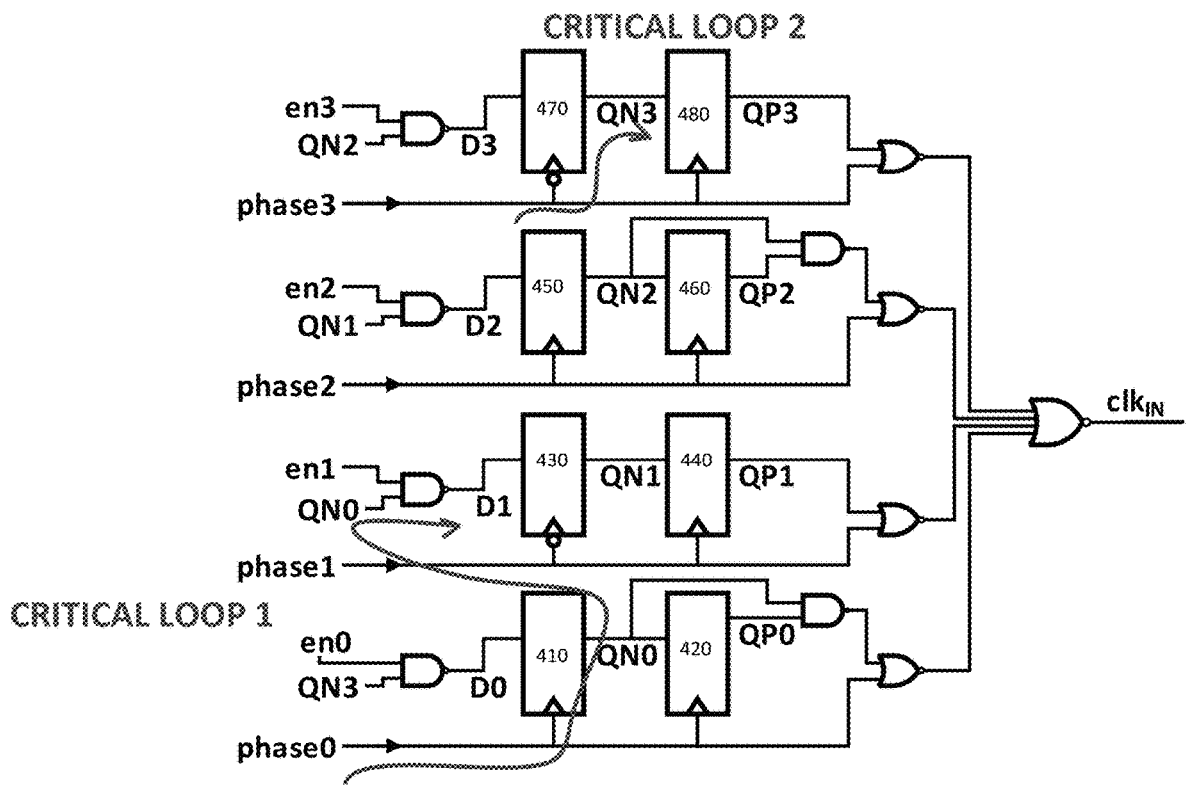
FIG. 4 is a diagram illustrating components of an alternative digital multiplexer circuit according to aspects of the subject technology.

FIG. 4 is a diagram illustrating components of an alternative digital multiplexer circuit according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 4, multiplexer circuit 400 includes a pair of D flip-flops for each of the multi-phase clock signals (e.g., D flip-flops 410 and 420 for phase 0, D flip-flops 430 and 440 for phase 1, D flip-flops 450 and 460 for phase 2, and D flip-flops 470 and 480 for phase 3) that are clocked by the respective multi-phase clock signals. Each of the first D flip-flops in each pair (e.g., D flip-flops 410, 430, 450, and 470) receives as an input (D0, D1, D2, D3) a respective selection signal (en0, en1, en2, en3) that is retimed via a NAND gate using an output (QN0, QN1, QN2, QN3) of the first D flip-flop corresponding to a preceding multi-phase clock signal. For example, en3 is retimed using QN2, en2 is retimed using QN1, en1 is retimed using QN0, and en0 is retimed using QN3. Retiming the selection signal ensures that a current multi-phase clock signal is deselected before selecting the next multi-phase clock signal. The output of the first D flip-flops in each pair is provided as an input to the respective second D flip-flops in each pair (e.g., D flip-flops 420, 440, 460, and 480). The selected multi-phase clock signal is provided to counter circuit 140 as an input clock signal via two tiers of NOR gates.

Implementations of frequency divider device 100 using multiplexer circuit 400 include two critical divider loops for switching between multi-phase clock signals. As illustrated in FIG. 4, a first critical divider loop includes one D flip-flop (e.g., D flip-flop 410) and one logic gate (e.g., NAND gate generating D1) and has time available to make the switch equal to $(M/2+1)/F_{VCO}$. A second critical divider loop includes one D flip-flop (e.g., D flip-flop 470) and has time available to make the switch equal to $(M/2)/F_{VCO}$. Both critical divider loops have more available time to make the switch than the amount of time available in conventional systems and have fewer logic and circuit elements in the critical divider loops than in conventional systems. Accordingly, the subject technology allows higher frequencies ($F_{VCO}$) to be used without violating critical timing requirements.

Figure 5:
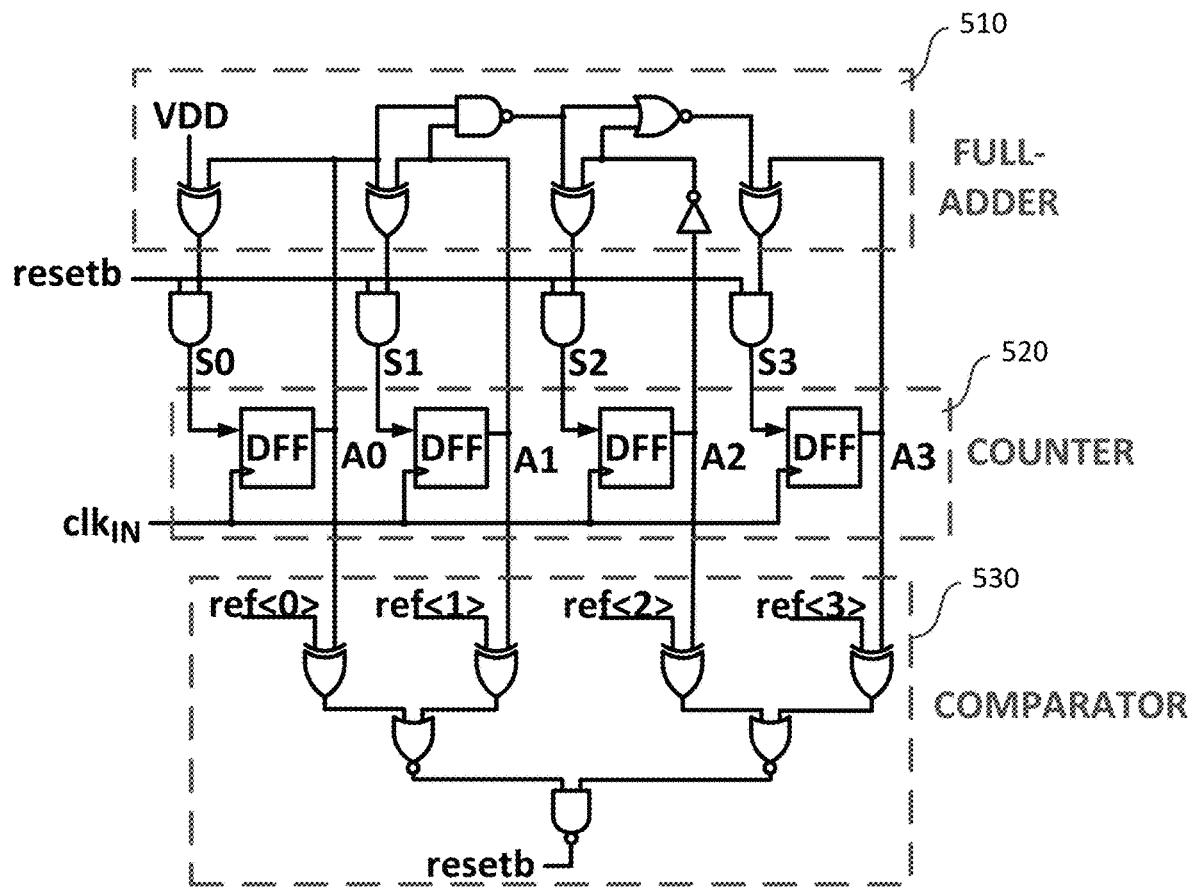
FIG. 5 is a diagram illustrating components of a counter circuit according to aspects of the subject technology.

According to aspects of the subject technology, counter circuit 140 includes suitable logic, circuitry, and/or code to count cycles of the input clock signal $CLK_{IN}$ and periodically generate a pulse of an output clock signal $CLK_{OUT}$ based on the cycle count. FIG. 5 is a diagram illustrating components of one example of a counter circuit according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 5, counter circuit 500 includes full-adder circuit 510, cycle counter circuit 520, and comparator circuit 530. According to aspects of the subject technology, counter circuit 500 is configured to count cycles (e.g., rising edges) of the input clock signal $CLK_{IN}$ provided by multiplexer circuit 120. Cycle counter circuit 520 may include a series of D flip-flops each clocked by the input clock signal $CLK_{IN}$. The inputs to the series of D flip-flops may be respective bits of a binary cycle count (S0, S1, S2, S3) and the outputs of the series of D flip-flops (A0, A1, A2, A3) may be provided to full-adder circuit 510 configured to increment the binary cycle count (S0, S1, S2, S3) in response to each rising edge of the input clock signal clocking the D flip-flops.

The outputs of the D flip-flops (A0, A1, A2, A3) also may be provided to comparator circuit 530 configured to compare the binary value of the outputs (A0, A1, A2, A3) to a binary reference value represented in reference bits (ref<0>, ref<1>, ref<2>, ref<3>) provided to counter circuit 500. If the binary value of the outputs equals the binary reference value, comparator circuit 530 may be configured to activate a reset signal (resetb) to reset the binary cycle count (S0, S1, S2, S3) to zero using a series of AND gates. In addition, counter circuit 500 is configured to generate a pulse of an output clock signal ($CLK_{OUT}$) in response to the binary value of the outputs equaling the binary reference value. For example, the D flip-flop output for the most significant bit of A0, A1, A2, A3 corresponding to the binary reference value may be used as the output clock signal ($CLK_{OUT}$).

According to aspects of the subject technology, the reference value provided to counter circuit 500 may be a configurable parameter used to select a portion of the overall division ratio for frequency divider device 100. In this regard, the reference value may equal the division ratio of the frequency of the input clock signal to the frequency of the output clock signal. In the example illustrated in FIG. 5, the number of bits used for the reference value (N) is four. The subject technology is not limited to this number of bits and may be implemented with a different number of bits. Increasing the number of bits provides a broader range of values (between 2 and $2^N-1$) within which the reference value may be set but at the expense of more logic gates and circuit elements needed to implement counter circuit 500 which may decrease an operating speed of counter circuit 500. On the other hand, decreasing the number of bits narrows the range of possible reference values but may increase the operating speed of counter circuit 500 due to the reduction in the number of logic gates and circuit elements needed to implement counter circuit 500.

Figure 6:
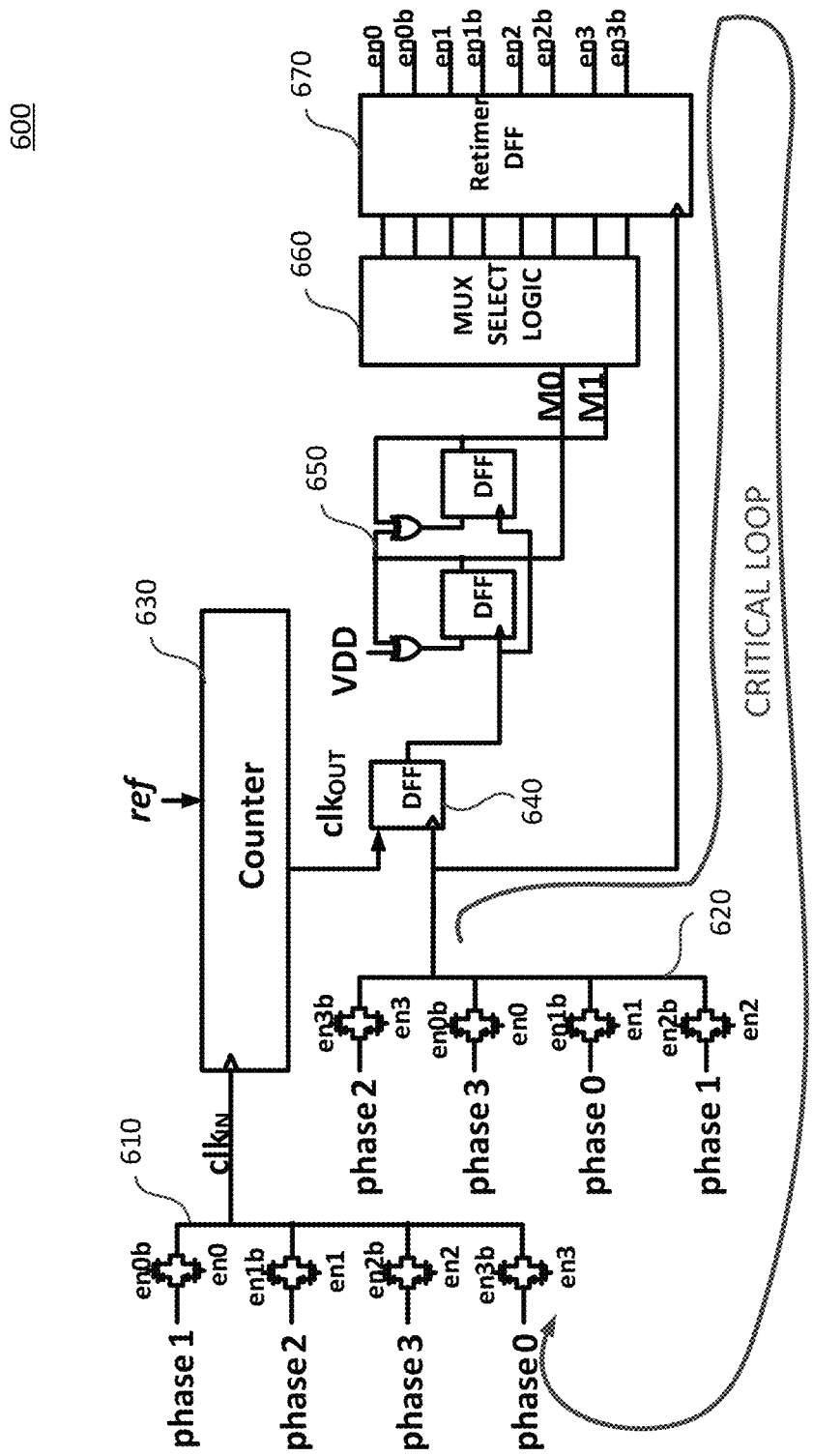
FIG. 6 is a block diagram illustrating components of a divider module according to aspects of the subject technology.

FIG. 6 is a block diagram illustrating components of a divider module according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 6, divider module 600 includes first multiplexer circuit 610, second multiplexer circuit 620, counter circuit 630, flip-flop 640, sequence circuit 650, logic circuit 660, and retimer circuit 670. First multiplexer circuit 610 and/or second multiplexer circuit 620 may be an analog multiplexer circuit, which was described above with respect to FIG. 2 and the description of the components and general operation of the analog multiplexer circuit will not be repeated here. Similarly, the components and general operation of a counter circuit such as counter circuit 630 were described above with respect to FIG. 5 and will not be repeated here.

First multiplexer circuit 610 may be configured to provide to counter circuit 630 one of the multi-phase clock signals selected from the sequence of multi-phase clock signals provided to inputs of first multiplier circuit 610 as input clock signal $CLK_{IN}$. As described above, counter circuit 630 may be configured to count cycles of input clock signal $CLK_{IN}$ and periodically generate a clock pulse of output clock signal $CLK_{OUT}$ in response to the cycle count of the input clock signal reaching a reference value provided to counter circuit 630. In addition to making the output clock signal available for data processing outside of divider module 600, divider module 600 may be configured to switch the multi-phase clock signal provided to counter circuit 630 by first multiplexer circuit 610 to a next multi-phase clock signal in the sequence of multi-phase clock signals provided to first multiplexer circuit 610 in response to the generated clock pulse of the output clock signal. For example, first multiplexer circuit 610 may switch from providing the phase 1 clock signal as the input clock signal to providing the phase 2 clock signal as the input clock signal when the selection signals en0 and en0b transition to in inactive state and the selection signals en1 and en1b transition to an active state. The transition of the selection signals may be controlled by a selection circuit that includes sequence circuit 650, logic circuit 660, and retimer circuit 670, for example.

According to aspects of the subject technology, sequence circuit 650 includes suitable logic, circuitry, and/or code configured to increment a sequence count value stored in bits M0 and M1 every time counter circuit 630 outputs a clock pulse of the output clock signal. As depicted in FIG. 6, sequence circuit 650 may include a pair of D flip-flops and a pair of XOR logic gates configured as a counter clocked by the output clock signal provided to sequence circuit 650 via flip-flop 640, where the outputs of the two D flip-flops provide the bits M0 and M1. The number of bits used to store the sequence count, and correspondingly the number of D flip-flops and XOR logic gates in sequence circuit 650, may vary from two. For example, the number of bits used to store the sequence count may have a capacity large enough to store a sequence count value equal to the number of multi-phase clock signals (M) in the sequence of multi-phase clock signals provided to first multiplexer circuit 610. In the example depicted in FIG. 6, the number of multi-phase clock signals in the sequence is equal to four (M=4) which can be stored using the two bits M0 and M1. If, for example, the number of multi-phase clock signals was equal to eight (M=8), sequence circuit 650 may use three bits (M0, M1, M2) to store the sequence count.

According to aspects of the subject technology, logic circuit 660 includes suitable logic, circuitry, and/or code to convert the sequence count (M0 M1) provided to logic circuit 660 by sequence circuit 650 into a selection signal used by first multiplexer circuit 610 to select a multi-phase clock signal from the sequence of multi-phase clock signals. In the example depicted in FIG. 6, the selection signal may be a pair of enable signals (e.g., en0/en0b, en1/en1b, en2/en2b, or en3/en3b) that is activated to select the corresponding multi-phase clock signal in first multiplexer circuit 610. Each value of the sequence count may correspond to a respective pair of enable signals. For example, a sequence count of zero may correspond to enable signals en0 and en0b; a sequence count of one may correspond to enable signals en1 and en1b; a sequence count of two may correspond to enable signals en2 and en2b; and a sequence count of three may correspond to enable signals en3 and en3b. When the sequence count reaches three, the next clock pulse of the output clock signal resets the sequence count to start over from zero. In this manner, the sequence of multi-phase clock signals may be periodically selected in a continuous loop (e.g., phase 1 to phase 2, phase 2 to phase 3, phase 3 to phase 0, phase 0 back to phase 1).

Figure 7:
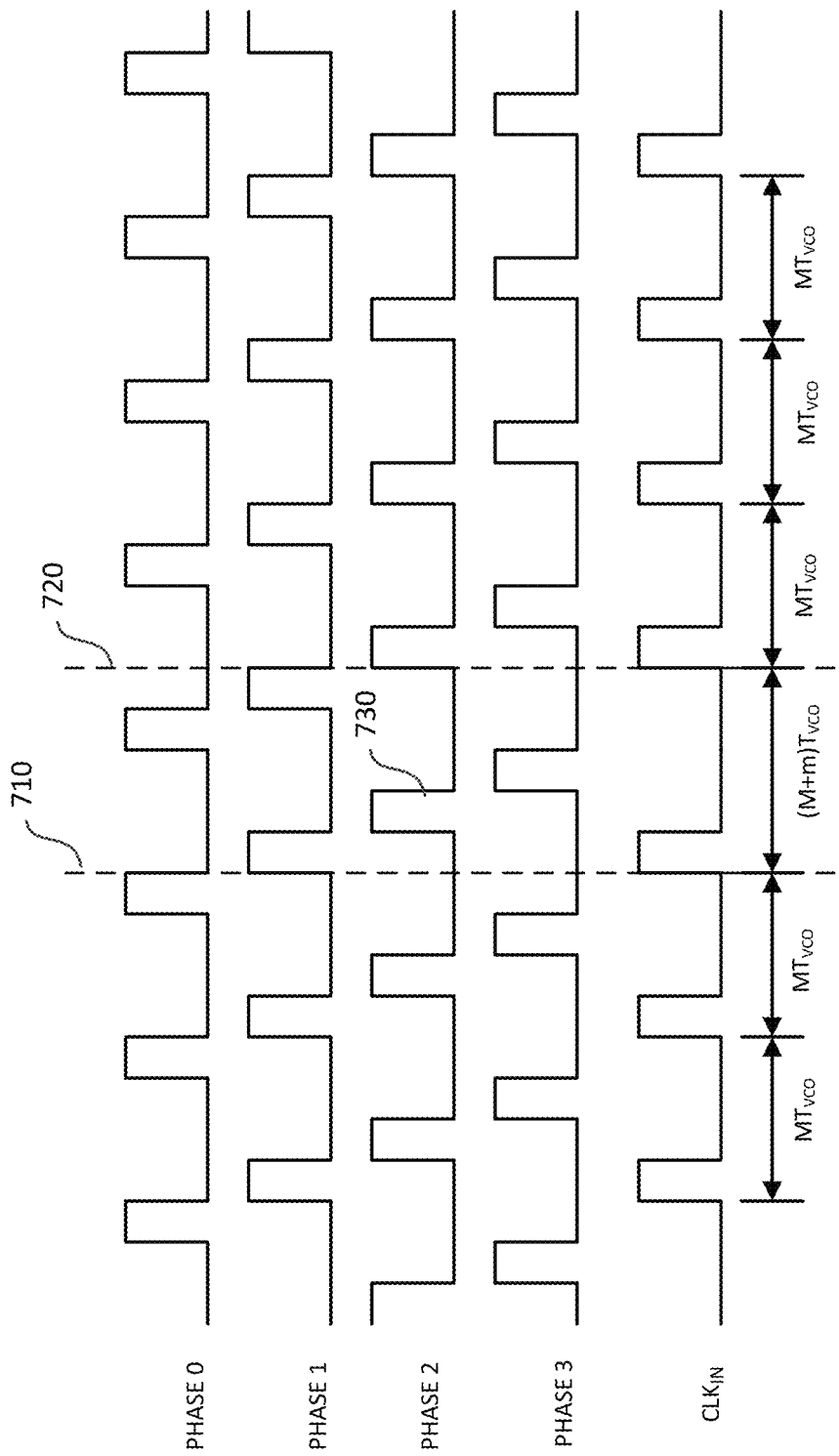
FIG. 7 is a signal diagram illustrating the relative timing of the sequence of multi-phase clock signals provided to a first multiplexer circuit and the input clock signal provided by first multiplexer circuit to a counter circuit.

FIG. 7 is a signal diagram illustrating the relative timing of the sequence of multi-phase clock signals (e.g., phase 0, phase 1, phase 2, phase 3) provided to first multiplexer circuit 610 and the input clock signal ($CLK_{IN}$) provided by first multiplexer circuit 610 to counter circuit 630. As mentioned above, when the number of multi-phase clock signals in the sequence equals four (M=4), the duty cycle ratio of the multi-phase clock signals may be ¼ (duty cycle of 25%) and each multi-phase clock signal may be phase shifted by 90 degrees relative to adjacent multi-phase clock signals in the sequence (e.g., phase 0 is shifted by 90 degrees relative to phase 1 and phase 3, phase 1 is shifted by 90 degrees relative to phase 0 and phase 2, phase 2 is shifted by 90 degrees relative to phase 1 and phase 3, and phase 3 is shifted by 90 degrees relative to phase 2 and phase 0).

In the example depicted in FIG. 7, the phase 1 clock signal is initially selected by the multiplexer circuit to be provided as the input clock signal to the counter circuit. After the rising edge of the phase 1 clock signal marked by dashed line 710, the cycle count of the input clock signal may reach the reference value triggering the generation of the output clock signal by the counter circuit. As noted above, the output clock signal causes the sequence count of the logic circuit to increment resulting in a different pair of enable signals being activated to select the next multi-phase signal in the sequence. Referring back to FIG. 6, incrementing the sequence count stored in bits M0 and M1 results in the pair of enable signals en0 and en0b corresponding to the phase 1 clock signal being deactivated and the pair of enable signals en1 and en1b corresponding to the phase 2 clock signal being activated so that first multiplexer circuit 610 selects the phase 2 clock signal and provides that clock signal as the input clock signal to counter circuit 630.

Switching the input clock signal from the phase 1 clock signal to the phase 2 clock signal modulates the input clock signal by lengthening the period of one of the input clock signal pulses. This lengthening is illustrated in FIG. 7 where the first two marked clock pulses have periods of $MT_{VCO}$, where M is the number of multi-phase clock signals in the sequence and $T_{VCO}$ is the clock period of the system clock signal $CLK_{VCO}$. When the multiplexer circuit switches from providing the phase 1 clock signal as the input clock signal to providing the phase 2 clock signal as the input clock signal, the period of that clock pulse elongates to $(M+m)T_{VCO}$, where m equals a predetermined number of phases, or phase shifts, of the multi-phase clock signals that are jumped in the transition. For example, in FIG. 7 the transition from the phase 1 clock signal to the phase 2 clock signal is a jump of a single phase or 90-degree phase shift which would make m equal to one. After the lengthened clock period, the clock cycles return to periods of $MT_{VCO}$. The process repeats every time the cycle count of the input clock signal reaches the reference value provided to the counter circuit.

Periodically lengthening the clock period of the input clock signal modulates the input clock signal by reducing its frequency which alters the division ratio of the frequency of the system clock signal to the frequency of the output clock signal. For example, the division ratio may be equal to the reference value*M*(1+m/M), wherein the 1+m/M factor takes into account the periodic modifications to the clock period of the input clock signal. It is noted that the input clock signal may be modulated by periodically shortening the clock period of the input clock signal by switching to a multi-phase clock signal in the sequence that jumps back one or more phases or phase shifts thereby increasing the frequency of the input clock signal. For example, rather than transitioning from the phase 1 clock signal to the phase 2 clock signal, the transition could be to the phase 0 clock signal in which the next clock cycle of the phase 0 clock signal after the transition is a 90-degree phase shift closer to the phase of the phase 1 clock signal. This would make the value of m negative and reduce the clock cycle period to $(M-m)T_{VCO}$.

The value of m may be predetermined at the time of design and/or configuration of the divider module based on the sequence of multi-phase clock signals the divider module is configured to transition through providing to the counter circuit during operation. In the example above, the divider module is configured to switch or transition to the next multi-phase clock signal in the sequence (phase 0, phase1, phase 2, phase 3) at each transition which sets m=1. According to aspects of the subject technology, the division ratio of the divider module may be modified by configuring the divider module to transition to a next multi-phase clock signal a predetermined number of clock signals greater than one away from a current multi-phase clock signal in the sequence. For example, the divider module may be configured to transition the multiplexer circuit from providing the phase 1 clock signal to the counter circuit to providing the phase 3 clock signal to the counter circuit. In this example, the value of m would be two representing the predetermined number of clock signals the next multi-phase clock signal (e.g., phase 3 clock signal) is away from the current multi-phase clock signal (e.g., phase 1 clock signal) at each transition as well as the two 90-degree phase shifts between the phase 1 clock signal and the phase 3 clock signal.

Returning to FIG. 7, a problem may occur when transitioning between the phase 1 clock signal and the phase 2 clock signal to lengthen the clock period of the input clock signal. Ideally, when transitioning to the phase 2 clock signal, the rising edge of the phase 2 clock signal marked with dotted line 720 is the next rising edge following the rising edge of the phase 1 clock signal marked with dotted line 710. However, as flagged in FIG. 7, the phase 2 clock signal has a rising edge 730 immediately after the marked rising edge of the phase 1 clock signal. If this rising edge were passed through as the next rising edge of the input clock signal, the period of the input clock signal would be significantly shortened rather than lengthened. To address this issue, the enable signals provided to the first multiplexer circuit may be retimed using another one of the multi-phase clock signals.

According to aspects of the subject technology, retimer circuit 670 in FIG. 6 includes logic, circuitry, and/or code to retime the provision of the enable signals to first multiplexer circuit 610 based on a multi-phase clock signal selected by second multiplexer circuit 620. For example, retimer circuit 670 may include a group of D flip-flops whose inputs are provided with the activated or deactivated enable signals determined by logic circuit 660 and the outputs of the D flip-flops pass the activated and deactivated enable signals to first multiplexer circuit 610. The enable signals also may be passed to second multiplexer circuit 620 to select the multi-phase clock signal from the sequence of multiphase clock signals for the retiming operation. As depicted in FIG. 6, the same pair of enable signals are provided to select different multi-phase clock signals in first multiplexer circuit 610 compared to the selection by second multiplexer circuit 620. For example, the pair of enable signals en0 and en0b select the phase 1 clock signal in first multiplexer circuit 610 and select the phase 3 clock signal in second multiplexer circuit 620. As shown in FIG. 7, the next rising clock edge of the phase 3 clock signal following the rising clock edge of the phase 1 clock signal marked with dotted line 710 falls after rising edge 730 of the phase 2 clock signal. Using the phase 3 clock signal to clock the retimer circuit avoids the potential issue of capturing the rising clock edge 730 of the phase 2 clock signal.

The critical timing loop of divider module 600 is illustrated on FIG. 6 and occurs when the multiplexer circuit is transitioning between multi-phase clock signals using the pairs of enable signal provided by retimer circuit 670. The smallest available time for this transition is $2/F_{VCO}$, which may be double the amount of time available in conventional solutions. In addition, the critical divider loop may contain just one clk-to-q of a D flip-flop, which may be significantly quicker with fewer components than found in conventional solutions.

The range of division ration between a frequency of the system clock signal and a frequency of the output clock signal may be achievable from a continuous range from M to $2(2^N-1)(M-1)$. For N=4 and M=4, the range is continuous from 4 to 90, including prime numbers in that range.

Figure 8:
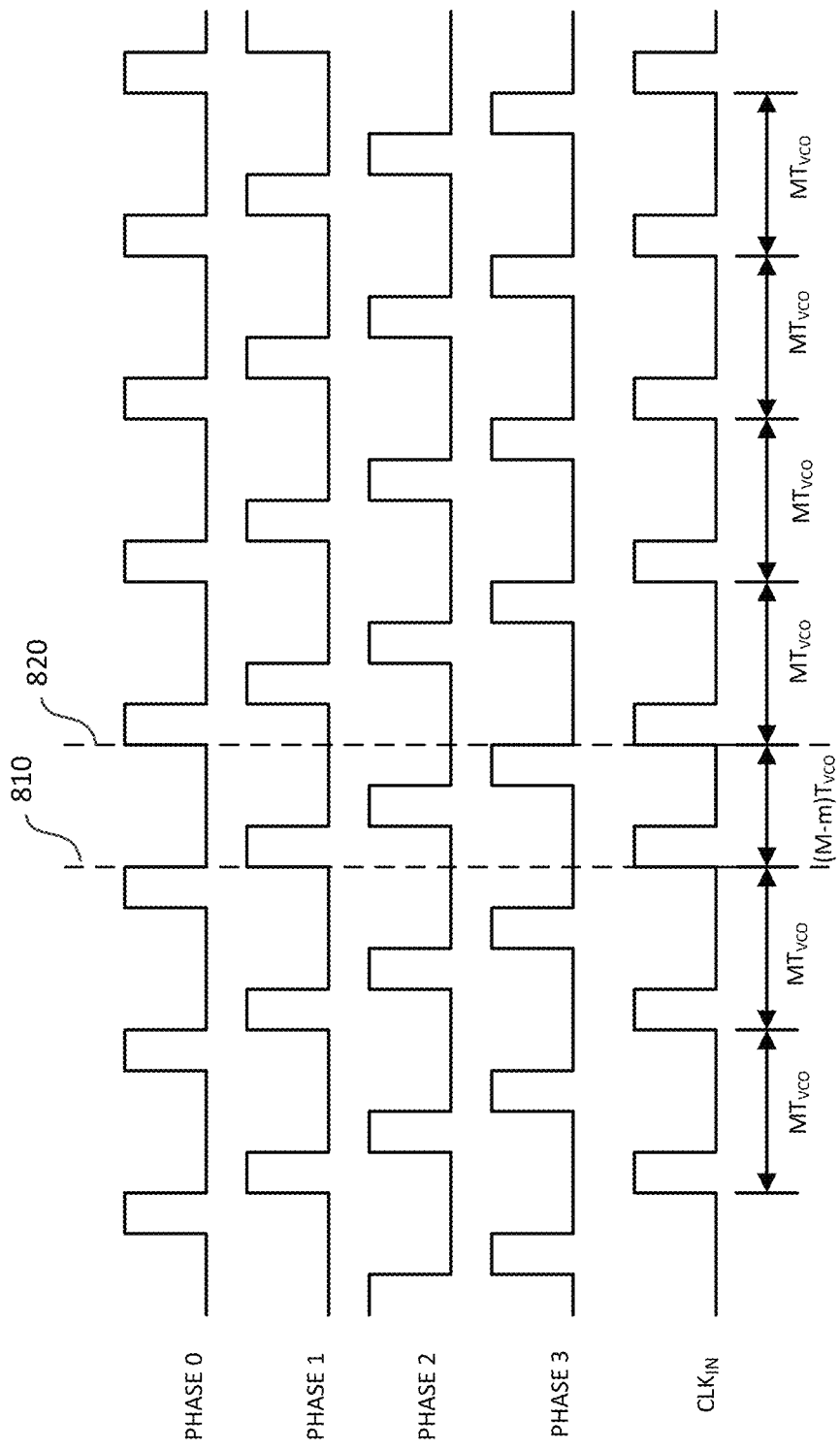
FIG. 8 is a signal diagram illustrating the relative timing of the sequence of multi-phase clock signals provided to a first multiplexer circuit and the input clock signal provided by first multiplexer circuit to a counter circuit.

FIG. 8 is a signal diagram illustrating the relative timing of the sequence of multi-phase clock signals (e.g., phase 0, phase 1, phase 2, phase 3) provided to first multiplexer circuit 610 and the input clock signal ($CLK_{IN}$) provided by first multiplexer circuit 610 to counter circuit 630. As with the example presented in FIG. 7, the number of multi-phase clock signals in the sequence equals four (M=4) and the duty cycle ratio of the multi-phase clock signals may be ¼ (duty cycle of 25%) where each multi-phase clock signal is phase shifted by 90 degrees relative to adjacent multi-phase clock signals in the sequence.

In the example depicted in FIG. 8, the phase 1 clock signal is initially selected by the multiplexer circuit to be provided as the input clock signal to the counter circuit. After the rising edge of the phase 1 clock signal marked by dashed line 810, the cycle count of the input clock signal may reach the reference value triggering the generation of the output clock signal by the counter circuit. As noted above, the output clock signal causes the sequence count of the logic circuit to increment resulting in a different pair of enable signals being activated to select the next multi-phase signal in the sequence. Rather than transitioning from the phase 1 clock signal to the phase 2 clock signal, the example in FIG. 8 illustrates a transition from the phase 1 clock signal to the phase 0 clock signal at the rising edge of the phase 0 clock signal indicated by the dashed line 820.

Switching the input clock signal from the phase 1 clock signal to the phase 0 clock signal results in shortening the period of one of the input clock signal pulses. This shortening is illustrated in FIG. 8 where the first two marked clock pulses have periods of $MT_{VCO}$, where M is the number of multi-phase clock signals in the sequence and Tyco is the clock period of the system clock signal $CLK_{VCO}$. When the multiplexer circuit switches from providing the phase 1 clock signal as the input clock signal to providing the phase 0 clock signal as the input clock signal, the period of that clock pulse shortens to $(M-m)T_{VCO}$, where m equals a number of phases, or phase shifts, of the multi-phase clock signals that are jumped in the transition. For example, in FIG. 8 the transition from the phase 1 clock signal to the phase 0 clock signal is a jump back of a single phase or 90-degree phase shift which would make m equal to one. After the shortened clock period, the clock cycles return to periods of $MT_{VCO}$. The process repeats every time the cycle count of the input clock signal reaches the reference value provided to the counter circuit. Periodically shortening the clock period of the input clock signal increases its frequency which alters the division ratio of the frequency of the system clock signal to the frequency of the output clock signal.

Figure 9:
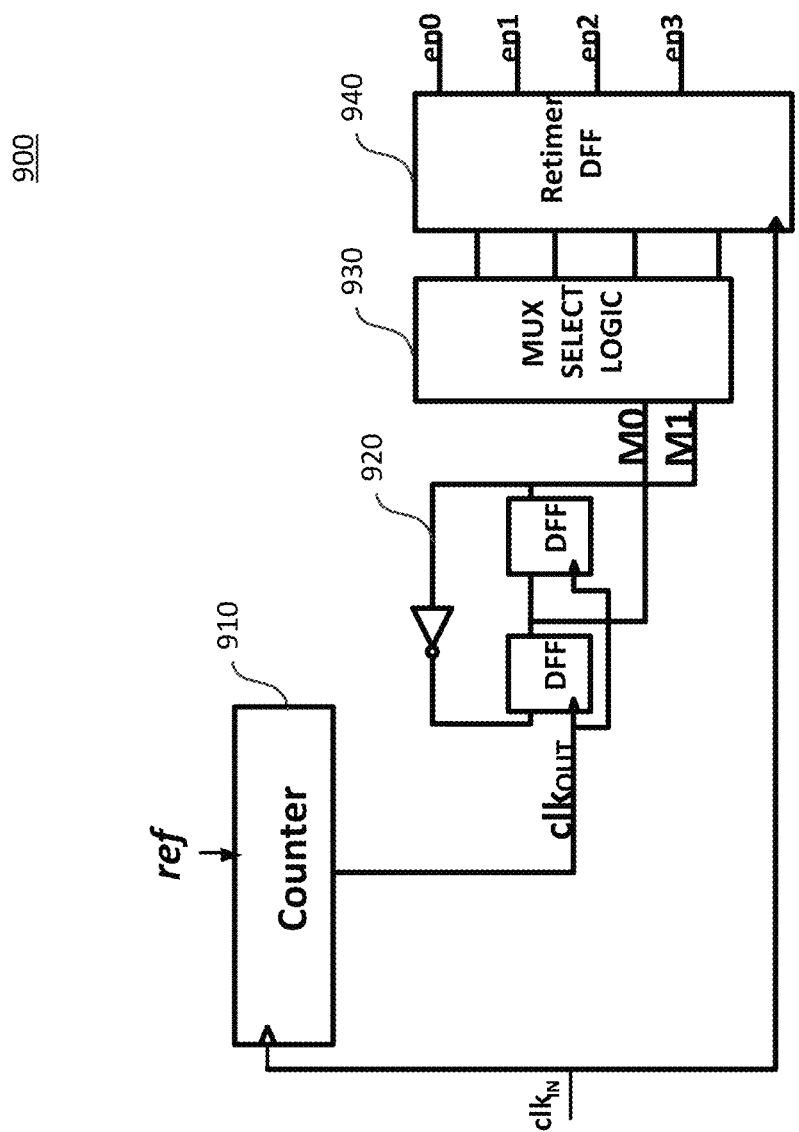
FIG. 9 is a block diagram illustrating components of a divider module according to aspects of the subject technology.

FIG. 9 is a block diagram illustrating components of a divider module according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 9, divider module 900 includes counter circuit 910 and a selection circuit comprising sequence circuit 920, logic circuit 930, and retimer circuit 940. Divider module 900 may be used with a digital multiplexer circuit such as the ones described above with respect to FIGS. 3 and 4 providing the input clock signal ($CLK_{IN}$). The components and general operations of counter circuit 910, sequence circuit 920, logic circuit 930, and retimer circuit 940 are substantially the same as that described for like-named components in FIG. 6 and will not be repeated here.

Differences between divider module 600 and divider module 900 include divider module 900 using the input clock signal to clock both counter circuit 910 and retimer circuit 940. In addition, a second multiplexer circuit is not required and single enable signals are used to select multi-phase signals rather than pairs of enable signals as used in divider module 600.

Figure 10:
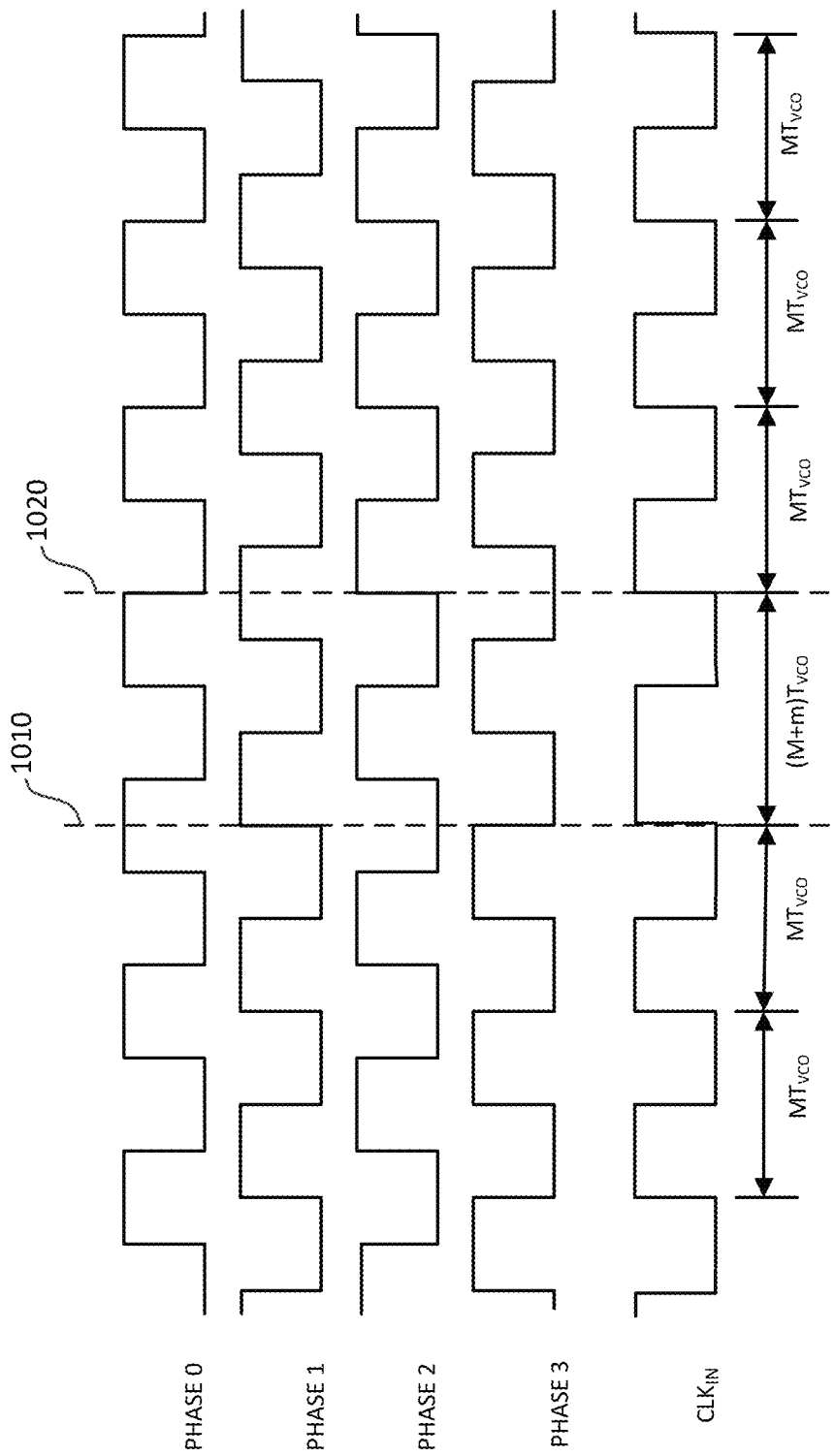
FIG. 10 is a signal diagram illustrating the relative timing of the sequence of multi-phase clock signals provided to a first multiplexer circuit and the input clock signal provided by first multiplexer circuit to a counter circuit.

FIG. 10 is a signal diagram illustrating the relative timing of the sequence of multi-phase clock signals (e.g., phase 0, phase 1, phase 2, phase 3) provided to a digital multiplexer circuit, such as the digital multiplexer circuits described with respect to FIGS. 3 and 4, and the input clock signal ($CLK_{IN}$) provided by the digital multiplexer circuit to a counter circuit such as counter circuit 910 in FIG. 9. The example depicted in FIG. 10 illustrates a transition from the rising edge 1010 of the phase 1 clock signal to the rising edge 1020 of the phase 2 clock signal to lengthen the period of one of the input clock signal pulses. The impact of this transition on the period and frequency of the input clock signal is similar to that described above with respect to FIG. 7. FIG. 10 is presented to illustrate that when using a digital multiplexer circuit, the duty cycles of the multi-phase clock signals may be 50% and not limited by the number of multi-phase clock signals generated. 50% duty cycles may be easier to achieve than smaller duty cycles such as 25%.

Figure 11:
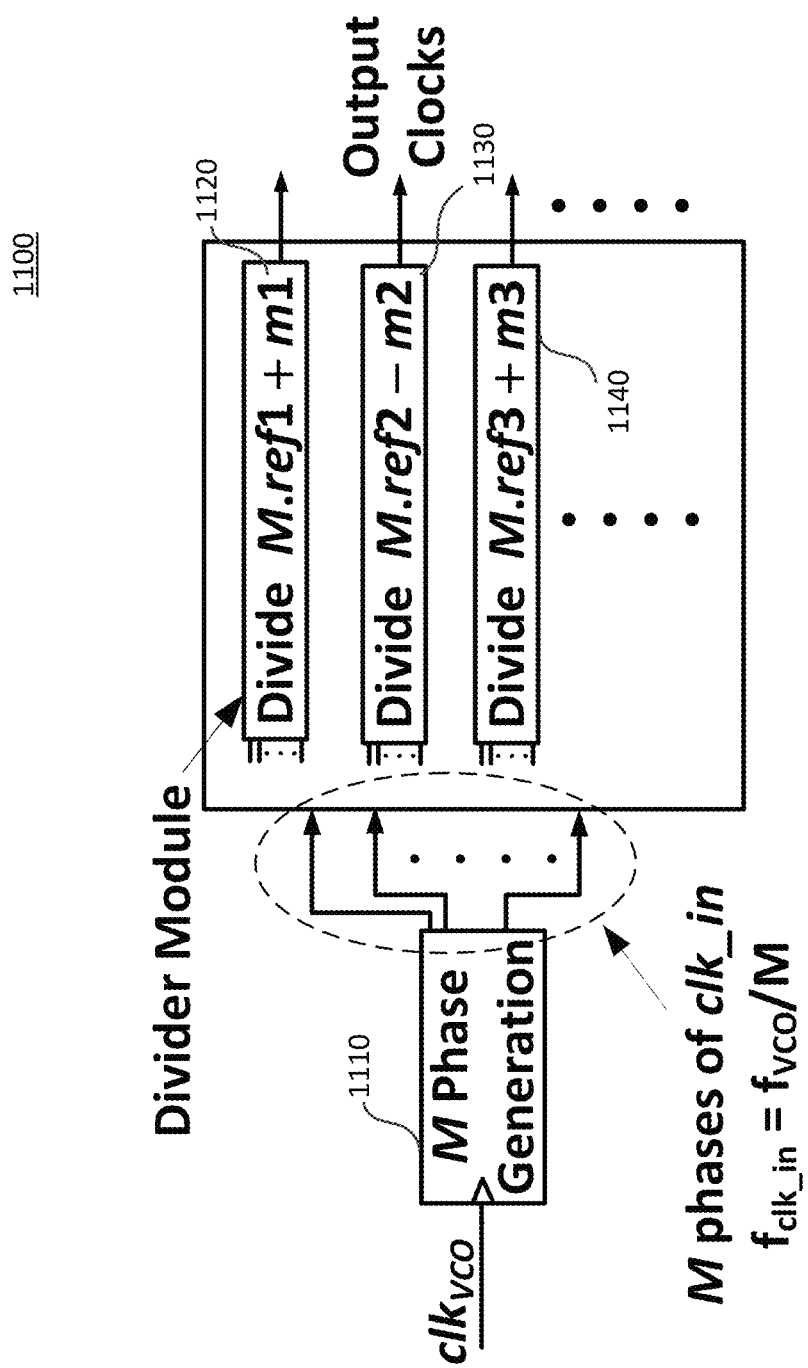
FIG. 11 is a block diagram depicting components of a frequency divider device according to aspects of the subject technology.

FIG. 11 is a block diagram depicting components of a frequency divider device according to aspects of the subject technology. Not all of the depicted components may be required, however, and one or more implementations may include additional components not shown in the figure. Variations in the arrangement and type of the components may be made without departing from the spirit or scope of the claims as set forth herein. Depicted or described connections and couplings between components are not limited to direct connections or direct couplings and may be implemented with one or more intervening components unless expressly stated otherwise.

As depicted in FIG. 11, frequency divider device 1100 includes multi-phase clock generator 1110, and divider modules 1120, 1130, and 1140. All the components of frequency divider device 1100 may be implemented in a single semiconductor device, such as a system on a chip (SoC). Alternatively, one or more of the components of frequency divider device 1100 may be implemented in a semiconductor device separate from the other components and mounted on a printed circuit board, for example, with the other components to form a system. In addition, one or more circuit elements may be shared between multiple circuit components depicted in FIG. 11. The subject technology is not limited to these two alternatives and may be implemented using other combinations of chips, devices, packaging, etc. to implement frequency divider device 1100.

As depicted in FIG. 11, frequency divider device 1100 includes multiple divider modules 1120, 1130, and 1140. The subject technology is not limited to three divider modules and may be implemented with more or less three divider modules. Each of divider modules 1120, 1130, and 1140 may each include the elements and functionality described above with respect to the divider modules in FIGS. 6 and 9, for example, and details of those elements and functionality will not be repeated here. According to aspects of the subject technology, each of the divider modules may be configured to receive a different sequence of multi-phase clock signals generated by multi-phase clock generator 1110. The reference values provided to each of the respective counter circuits may be individually configurable so that the respective counter circuits may receive the same reference value or different reference values. In addition, each of the divider modules may be configured to transition through the same sequence of multi-phase clock signals or different sequences of multi-phase clock signals resulting in the value of m possible having different values and/or signs for each divider module. In this manner, frequency divider device 1100 may take advantage of a single multi-phase clock generator to provide different combinations of multi-phase clock signal sequences to the different divider modules. Accordingly, multiple output clock signals having different frequencies may be generated for different data operations in the system containing the frequency divider device.

According to aspects of the subject technology, a device is provided that includes a counter circuit configured to count cycles of an input clock signal and to generate an output clock signal periodically based on a cycle count of the input clock signal; a multi-phase clock generator configured to generate a plurality of multi-phase clock signals from a system clock signal; a multiplexer circuit coupled to the multi-phase clock generator and configured to provide a multi-phase clock signal selected from the plurality of multi-phase clock signals to the counter circuit as the input clock signal; and a selection circuit configured to provide a selection signal to the multiplexer circuit periodically to switch the multi-phase clock signal provided to the counter circuit from a current multi-phase clock signal to a next multi-phase clock signal selected from the plurality of multi-phase clock signals.

The counter circuit may be configured to compare the cycle count of the input clock signal to a reference value; and when the cycle count equals the reference value: generate the output clock signal; and reset the cycle count. The reference value may be configurable. A division ratio of a frequency of the system clock signal to a frequency of the output clock signal may be a prime number. The plurality of multi-phase clock signals may comprise a sequence of clock signals, and wherein each clock signal in the sequence of clock signals may be phase shifted relative to adjacent clock signals in the sequence of clock signals. A number of the clock signals in the sequence of clock signals may be a power of two.

A frequency of each of the plurality of multi-phase clock signals may be equal to the frequency of the system clock signal divided by the number of clock signals in the sequence of clock signals. A duty cycle ratio of each of the plurality multi-phase clock signals may be equal to an inverse of the number of clock signals in the sequence of clock signals. Switching the multi-phase clock signal provided to the counter circuit from the current multi-phase clock signal to the next multi-phase clock signal may modulate a clock pulse of the input clock signal. The the next multi-phase clock signal is a predetermined number of clocks signals away from the current multi-phase clock signal in the sequence of clock signals. The frequency of the output clock signal may be set based on the reference value and the predetermined number of clock signals. The device may further include a retimer circuit configured to time the provision of the selection signal to the multiplexer circuit based on a multi-phase clock signal after the next multi-phase clock signal in the sequence of clock signals.

According to aspects of the subject technology, device may be provided that includes a counter circuit configured to count cycles of an input clock signal and to generate an output clock signal periodically based on a cycle count of the input clock signal reaching a reference value; a multiplexer circuit configured to provide a multi-phase clock signal selected from a sequence of multi-phase clock signals to the counter circuit as the input clock signal; and a selection circuit configured to modulate the input clock signal by periodically providing a selection signal to the multiplexer circuit to switch the multi-phase clock signal provided to the counter circuit from a current multi-phase clock signal to a next multi-phase clock signal in the sequence of multi-phase clock signals.

The selection circuit may be configured to provide the selection signal to the multiplexer circuit in response to the counter circuit generating a pulse of the output clock signal. Each of the multi-phase clock signals may have a common frequency and may be phase shifted relative to adjacent multi-phase clock signals in the sequence of multi-phase clock signals. The sequence of multi-phase clock signals may be generated from a system clock signal, and wherein a division ratio of a frequency of the output clock signal to the frequency of the system clock signal may be a prime number.

The selection circuit may include a sequence circuit configured to increment a sequence count value in response to a pulse of the output clock signal generated by the counter circuit; a logic circuit configured to convert the sequence count value to a set of enable signals; and a retimer circuit configured to time provision of the set of enable signals to the multiplexer circuit as the selection signal based on a multi-phase clock signal after the next multi-phase clock signal in the sequence of multi-phase clock signals.

According to aspects of the subject technology, a device is provided that includes a multi-phase clock generator configured to generate a plurality of multi-phase clock signals from a system clock signal, wherein each of the multi-phase clock signals has a common frequency and is phase shifted relative to other multi-phase clock signals in the plurality of multi-phase clock signals; and a plurality of divider modules. Each divider module includes a counter circuit configured to count cycles of an input clock signal and to generate a respective output clock signal periodically based on a cycle count of the input clock signal reaching a respective reference value; a multiplexer circuit configured to provide a multi-phase clock signal selected from a respective sequence of multi-phase clock signals from the plurality of multi-phase clock signals to the counter circuit as the input clock signal; and a selection circuit configured to modulate the input clock signal by periodically providing a selection signal to the multiplexer circuit to switch the multi-phase clock signal provided to the counter circuit from a current multi-phase clock signal to a next multi-phase clock signal in the respective sequence of multi-phase clock signals.

The respective reference values may be individually configurable. The respective sequences of multi-phase clock signals may be different from each other.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but are to be accorded the full scope consistent with the language of the claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. A device, comprising:
   a counter circuit configured to count cycles of an input clock signal and to generate an output clock signal periodically based on a cycle count of the input clock signal;
   a multi-phase clock generator configured to generate a plurality of multi-phase clock signals from a system clock signal;
   a multiplexer circuit coupled to the multi-phase clock generator and configured to provide a multi-phase clock signal selected from the plurality of multi-phase clock signals to the counter circuit as the input clock signal;
   one or more D-flip-flops for each of the plurality of multi-phase clock signals are clocked by a respective multi-phase clock signal of the plurality of multi-phase clock signals;
   a selection circuit configured to provide a selection signal to the multiplexer circuit periodically to switch the multi-phase clock signal provided to the counter circuit from a current multi-phase clock signal to a next multi-phase clock signal selected from the plurality of multi-phase clock signals; and
   each of a D-flip-flop of the one or more D-flip-flops of the current multi-phase clock signal is configured to receive as an input the selection signal that is retimed via a NAND gate, the NAND gate is coupled to an output of the D-flip-flop of the one or more D-flip-flops corresponding to a preceding multi-phase clock signal.

2. The device of claim 1, wherein the counter circuit is configured to:
   compare the cycle count of the input clock signal to a reference value; and
   when the cycle count equals the reference value:
      generate the output clock signal; and
      reset the cycle count.

3. The device of claim 2, wherein the reference value is configurable.

4. The device of claim 1, wherein the plurality of multi-phase clock signals comprises a sequence of clock signals and wherein a number of the clock signals in the sequence of clock signals is a power of two.

5. The device of claim 1, wherein the plurality of multi-phase clock signals comprises a sequence of clock signals and wherein a frequency of each of the plurality of multi-phase clock signals is equal to the frequency of the system clock signal divided by the number of clock signals in the sequence of clock signals.

6. The device of claim 1, wherein the plurality of multi-phase clock signals comprises a sequence of clock signals and wherein the next multi-phase clock signal is a predetermined number of clocks signals away from the current multi-phase clock signal in the sequence of clock signals.

7. The device of claim 6, wherein the frequency of the output clock signal is set based on a reference value and the predetermined number of clock signals.

8. A device, comprising:
   a counter circuit configured to count cycles of an input clock signal and to generate an output clock signal periodically based on a cycle count of the input clock signal reaching a reference value;
   a multiplexer circuit configured to provide a multi-phase clock signal selected from a sequence of multi-phase clock signals to the counter circuit as the input clock signal;
   a pair of D-flip-flops for each of the plurality of multi-phase clock signals configured to be clocked by a respective multi-phase clock signal of the plurality of multi-phase clock signals;
   a selection circuit configured to modulate the input clock signal by periodically providing a selection signal to the multiplexer circuit to switch the multi-phase clock signal provided to the counter circuit from a current multi-phase clock signal to a next multi-phase clock signal in the sequence of multi-phase clock signals; and a first D-flip-flop of the pair of D-flip-flops of the current multi-phase clock signal is configured to receive as an input the selection signal that is retimed via a NAND gate, the NAND gate is coupled to an output of the first D-flip-flop of the pair of D-flip-flops corresponding to a preceding multi-phase clock signal.

9. The device of claim 8, wherein each of the multi-phase clock signals has a common frequency and is phase shifted relative to adjacent multi-phase clock signals in the sequence of multi-phase clock signals.

10. A device, comprising:

a multi-phase clock generator configured to generate a plurality of multi-phase clock signals from a system clock signal, wherein each of the multi-phase clock signals has a common frequency and is phase shifted relative to other multi-phase clock signals in the plurality of multi-phase clock signals; and a plurality of divider modules, each divider module comprising:

a counter circuit configured to count cycles of an input clock signal and to generate a respective output clock signal periodically based on a cycle count of the input clock signal reaching a respective reference value;

a multiplexer circuit configured to provide a multi-phase clock signal selected from a respective sequence of multi-phase clock signals from the plurality of multi-phase clock signals to the counter circuit as the input clock signal;

one or more D-flip-flops for each of the plurality of multi-phase clock signals being clocked by a respective multi-phase clock signal of the plurality of multi-phase clock signals;

a selection circuit configured to modulate the input clock signal by periodically providing a selection signal to the multiplexer circuit to switch the multi-phase clock signal provided to the counter circuit from a current multi-phase clock signal to a next multi-phase clock signal in the respective sequence of multi-phase clock signals; and each of a D-flip-flop of the one or more D-flip-flops of the current multi-phase clock signal is configured to receive as an input the selection signal that is retimed via a NAND gate, the NAND gate is coupled to an output of the D-flip-flop of the one or more D-flip-flops corresponding to a preceding multi-phase clock signal.

11. The device of claim 10, wherein the respective sequences of multi-phase clock signals are different from each other.

* * * * *